（12）United States Patent
Liddicott (10) Patent No.: US 10,158,735 B2
(45) Date of Patent: Dec. 18, 2018

(54) READ-AHEAD ON SIGNED CONNECTIONS WITH UNSIGNING, INLINE, TRANSPARENT PROXIES

(71) Applicant: Dell Software Inc., Round Rock, TX (US)

(72) Inventor: Samuel Liddicott, Wakefield (GB)

(73) Assignee: SONICWALL INC., Milpitas, CA (US)

( * ) Notice: Subject to any disclaimer, the term of this patent is extended or adjusted under 35 U.S.C. 154(b) by 94 days.

(21) Appl. No.: 14/821,635

(22) Filed: Aug. 7, 2015

(65) Prior Publication Data

US 2017/0041431 A1     Feb. 9, 2017

(51) Int. Cl.
*H04L 29/08* (2006.01)
*H04L 29/06* (2006.01)
*H03M 7/30* (2006.01)

(52) U.S. Cl.
CPC ............. *H04L 67/28* (2013.01); *H03M 7/30* (2013.01); *H04L 67/2828* (2013.01); *H04L 69/04* (2013.01)

(58) Field of Classification Search
CPC ..... H04L 67/28; H04L 67/2828; H04L 69/04; H03M 7/30
See application file for complete search history.

(56) References Cited

U.S. PATENT DOCUMENTS

| | | | |
|---|---|---|---|
| 5,991,713 A * | 11/1999 | Unger | H03M 7/3084 704/1 |
| 6,282,542 B1 * | 8/2001 | Carneal | G06F 17/30902 |
| 6,826,152 B1 | 11/2004 | Kroon | |
| 7,120,666 B2 * | 10/2006 | McCanne | H04L 67/2828 709/203 |
| 7,254,636 B1 | 8/2007 | O'Toole, Jr. et al. | |
| 7,716,307 B1 | 5/2010 | Ben-Shaul et al. | |
| 7,809,693 B2 * | 10/2010 | Lango | G06F 17/30067 707/679 |

(Continued)

OTHER PUBLICATIONS

U.S. Appl. No. 14/591,781 Office Action dated Nov. 18, 2016.

(Continued)

*Primary Examiner* — Blake J Rubin
(74) *Attorney, Agent, or Firm* — Polsinelli LLP (57) ABSTRACT

Innovative technologies for reducing network request response times over a server-signed connection are disclosed. The technologies may involve dynamically computing synchronized compression dictionaries using server responses to speculative or "read-ahead" client requests. The technologies operate even when the client is unable to accept the server responses due to server-signing constraints. A server proxy may receive a read-ahead request originating from a client proxy. After receiving a response to the read-ahead request from a server, the server proxy may populate a compression dictionary and forward the read-ahead request to the client proxy. The client proxy may populate its own synchronized compression dictionary using the forwarded read-ahead response. The server proxy and client proxy may use the compression dictionaries to respectively compress and decompress a response to an actual client request that matches or is highly similar to the earlier response to the read-ahead request.

25 Claims, 5 Drawing Sheets

(56) References Cited

U.S. PATENT DOCUMENTS

| | | | |
|---|---|---|---|
| 8,090,866 B1 | 1/2012 | Bashyam et al. | |
| 8,112,505 B1 | 2/2012 | Ben-Shaul et al. | |
| 8,176,186 B2* | 5/2012 | McCanne | H03M 7/30 |
| | | | 709/228 |
| 8,244,864 B1 | 8/2012 | Bahl et al. | |
| 8,386,637 B2* | 2/2013 | Ly | H04L 67/2814 |
| | | | 709/238 |
| 9,813,526 B2 | 11/2017 | Liddicott | |
| 9,917,882 B2 | 3/2018 | Liddicott | |
| 2003/0039248 A1 | 2/2003 | Weaver | |
| 2003/0065796 A1 | 4/2003 | Borr | |
| 2003/0084183 A1 | 5/2003 | Odlund et al. | |
| 2003/0204593 A1 | 10/2003 | Brown et al. | |
| 2004/0088375 A1* | 5/2004 | Sethi | G06F 17/30902 |
| | | | 709/218 |
| 2004/0255048 A1* | 12/2004 | Lev Ran | G06F 9/546 |
| | | | 709/249 |
| 2005/0015461 A1 | 1/2005 | Richard | |
| 2005/0086306 A1 | 4/2005 | Lemke | |
| 2005/0114436 A1 | 5/2005 | Betarbet | |
| 2005/0262220 A1 | 11/2005 | Ecklund | |
| 2007/0124477 A1 | 5/2007 | Martin | |
| 2007/0250552 A1* | 10/2007 | Lango | H04L 67/2842 |
| 2008/0229025 A1* | 9/2008 | Plamondon | G06F 12/0862 |
| | | | 711/126 |
| 2009/0024763 A1* | 1/2009 | Stepin | H04L 63/0428 |
| | | | 709/247 |
| 2009/0077252 A1 | 3/2009 | Abdo | |
| 2009/0222515 A1 | 9/2009 | Thompson et al. | |
| 2009/0276543 A1 | 11/2009 | Turner et al. | |
| 2009/0300162 A1 | 12/2009 | Demarie et al. | |
| 2010/0098092 A1* | 4/2010 | Luo | H04L 12/24 |
| | | | 370/401 |
| 2010/0177642 A1* | 7/2010 | Sebastian | H04L 12/1859 |
| | | | 370/248 |
| 2011/0051173 A1 | 3/2011 | Yagishita | |
| 2012/0226738 A1 | 9/2012 | Taneja et al. | |
| 2012/0254417 A1* | 10/2012 | Luna | H04L 67/2828 |
| | | | 709/224 |
| 2012/0257120 A1* | 10/2012 | Nakai | H04N 5/50 |
| | | | 348/731 |
| 2012/0257500 A1 | 10/2012 | Lynch | |
| 2012/0265892 A1 | 10/2012 | Ma | |
| 2013/0091303 A1 | 4/2013 | Mitra et al. | |
| 2013/0097309 A1* | 4/2013 | Ma | H04L 29/08099 |
| | | | 709/224 |
| 2013/0178195 A1* | 7/2013 | Luna | H04W 24/04 |
| | | | 455/414.1 |
| 2013/0198868 A1 | 8/2013 | Georgiev | |
| 2013/0297679 A1 | 11/2013 | Kim | |
| 2014/0026182 A1 | 1/2014 | Pearl | |
| 2014/0040353 A1* | 2/2014 | Sebastian | H04L 67/06 |
| | | | 709/203 |
| 2015/0089019 A1 | 3/2015 | Chou | |
| 2015/0106578 A1* | 4/2015 | Warfield | G06F 3/0613 |
| | | | 711/158 |
| 2015/0127715 A1* | 5/2015 | Dankberg | H04L 67/2857 |
| | | | 709/203 |
| 2015/0142874 A1* | 5/2015 | He | H04L 67/02 |
| | | | 709/203 |
| 2016/0085920 A1 | 3/2016 | Cyran | |
| 2016/0156696 A1 | 6/2016 | Liddicott | |
| 2016/0198020 A1 | 7/2016 | Zhao | |
| 2016/0218902 A1 | 7/2016 | Hwang et al. | |
| 2016/0241528 A1* | 8/2016 | Kulkarni | H04L 67/2842 |
| 2016/0335324 A1 | 11/2016 | Caulfield | |
| 2016/0352869 A1 | 12/2016 | Liddicott | |
| 2017/0366651 A1 | 12/2017 | Liddicott | |

OTHER PUBLICATIONS

U.S. Appl. No. 14/556,157 Office Action dated Nov. 15, 2016.
U.S. Appl. No. 14/556,157 Office Action dated Jun. 5, 2017.
U.S. Appl. No. 14/591,781 Final Office Action dated May 26, 2017.
U.S. Appl. No. 14/591,781 Office Action dated Nov. 17, 2017.
U.S. Appl. No. 14/591,781 Final Office Action dated Jul. 5, 2018.
U.S. Appl. No. 15/918,998, Samuel Liddicott, Transparent Deferred Spooling Store and Forward Based on Standard Network System and Client Interface, filed Mar. 12, 2018.

* cited by examiner

READ-AHEAD ON SIGNED CONNECTIONS WITH UNSIGNING, INLINE, TRANSPARENT PROXIES

BACKGROUND

Technical Field

The present disclosure concerns reducing network request response times over a server-signed network connection. More particularly, the present disclosure concerns reducing response times over a server-signed connection that includes unsigning, inline, transparent proxies.

Description of the Related Art

Managing and reducing network request response times is an ongoing challenge in today's increasingly data-rich world. Although many network connections are frequently active, most go idle for at least small periods of time in between communications. Idle connection time is highly valuable because it provides an opportunity to deploy response time reduction mechanisms. Read-ahead operations, for instance, can reduce the amount of data traversing a network connection in certain environments. Client proxies use read-ahead operations to proactively fetch data prior to receiving an actual client request for the data. To do so, a client proxy transmits a mimicked or "read-ahead" client request to an upstream network device (e.g., a server proxy, server, router, transparent bridge, or other network device). Upon receiving a response to the read-ahead request, the client proxy stores the response in memory (e.g., cache memory) for quick retrieval when it subsequently receives an actual client request that matches the read-ahead request. Doing so allows the client proxy to supply the response data to the client on-demand rather than having to transmit the request to a network device (e.g., a server proxy), wait for the device to process the request, and then wait for the response to traverse the network connection.

Although conventional read-ahead operations are beneficial in certain network environments, those in the networking field generally view such operations by unsigning, inline, transparent proxies as useless in environments that feature server-signed responses. In an environment employing a server-signed protocol (e.g., server message block or "SMB" protocols), a server processing a client request must securely sign each of its responses. The server signature assures the client that the response truly originated from the server as opposed to an impersonating device (e.g., in the case of a "man in the middle" attack or the presence of an inline, transparent proxy). The client cannot accept any response that lacks the requisite server signature. Although the problem may be mitigated when the proxies themselves possess copies of the server signing keys (e.g., they can resign the responses directly), transparent proxies often lack access to such keys. As a result, conventional read-ahead operations only work efficiently on signed connections featuring inline, transparent proxies when the speculative read-ahead request is identical to the actual client request received by the client proxy. If the actual client request differs such that the cached read-ahead response is not valid as a response to the actual client request, then the client will not accept the cached response. Because the client proxy cannot construct a valid signature, the signing field appearing in the read-ahead response stored by the client proxy will prevent the client proxy from constructing a valid response from the cached response.

Further compounding the problem, client requests transmitted using server-signed protocols feature a counter field called a message ID (or, interchangeably, a multiplex ID). When the server receives a client request containing a particular message ID, it must not only sign its response, but it must also include a matching message ID. If the message ID provided in the response fails to match the message ID in the client request, the client cannot accept the response. Thus, multiple issues limit the utility of using conventional read-ahead operations in signed connections that feature unsigning, inline proxies (e.g., transparent, inline proxies). As a result, valuable idle connection time is wasted when a connection employs a server-signing protocol and includes unsigning, inline, transparent proxies.

Like read-ahead operations, inline compression operations can also reduce the amount of data that must traverse a network connection. By reducing the size of the data requiring delivery, inline compression promotes faster transfers and lower network traffic. Inline compression on its own, however, fails to remedy the problems associated with using conventional read-ahead operations in signed connections that feature unsigning, inline proxies.

Thus, there is a need for technologies that better harness the benefits of read-ahead operations in server-signing environments despite the presence of unsigning, inline, transparent proxies.

SUMMARY OF THE CLAIMED INVENTION

Innovative technologies for reducing network request response times over a server-signed network connection are claimed.

A system for reducing network request response times over a server-signed network connection, includes a client proxy that communicates with a client over a network connection running a server-signing protocol. The system further includes a server proxy that receives a read-ahead request from the client proxy over the network connection. By executing instructions stored in memory, the server proxy identifies the read-ahead request as a read-ahead request as opposed to an actual client request originating from the client. The server proxy sends the read-ahead request to a server communicatively coupled to the server proxy over the network connection. The server proxy receives from the server a response to the read-ahead request. The server proxy then compresses the response to the read-ahead request using a compression dictionary associated with the server proxy.

A system for reducing network request response times over a server-signed network connection includes a server proxy that communicates with a server over a network connection running a server-signing protocol. The system further includes a client proxy that sends a first read-ahead request to the server proxy over the network connection. The client proxy receives from the server proxy a compressed response to the first read-ahead request. The client proxy then decompresses the compressed response to the first read-ahead request using a compression dictionary.

DETAILED DESCRIPTION

Innovative technologies for reducing network request response times over a server-signed network connection are provided. Although the present disclosure illustrates the novel technologies by way of various systems, methods, and computer-readable media (e.g., non-transitory storage media or other forms of storage media, such as a random-access memory disk), it should be understood that the embodiments described herein are exemplary only and are in no way limiting. For instance, although certain portions of the present disclosure discuss SMB protocols, the described technologies apply equally to other server-signing protocols. Namely, the technologies may be used with any protocol in which plain text is available and packets are signed by the server (or further signed by the client when client keys are available via delegation or the like). The technologies may be used with any protocol tunneled under a generic security service application program interface (GSSAPI) with integrity (i.e., authenticity) but without confidentiality (i.e., secrecy) and in which a client proxy can impersonate a client. The technologies may be used when a server-signed connection includes unsigning, inline, transparent proxies. The technologies may also be used with any data types in which subsequent reads may be predicted, such as file data, directory listings, directory listing metadata, file metadata, SQL query patterns, LDAP query patterns, or the like.

Although the figures provided herein depict embodiments implemented within an illustrative network environment, the technologies may be adapted to suit any number of network architectures. Persons of ordinary skill in the art will readily recognize and appreciate that the present disclosure suggests many other possible embodiments in addition to those expressly described in the present disclosure.

The technologies, as embodied by various systems, methods, and computer-readable storage media (e.g., non-transitory storage media), significantly reduces network request response times over a server-signed connection. In various embodiments, the technologies may involve dynamically computing a compression dictionary using server responses to requests. To take advance of idle time, a client proxy may generate, for example, read-ahead requests. The read-ahead requests may be speculative in the sense that the client proxy generates the read-ahead request based on a prediction about which data the client will request in the future. Responses to read-ahead requests may be discarded after being used to populate synchronized compression dictionaries associated with each of the client proxy and the server proxy. When the server proxy subsequently receives a response to an actual client request that matches or is highly similar to the response to the read-ahead request, the server proxy may compress the response to the actual client request using the compression dictionary. After receiving the compressed response from the server proxy, the client proxy may then decompress the response and transmit the decompressed response to the client. For purposes of the present disclosure, an exemplary definition of the term "actual client request" is a request that originated from a client as opposed to a speculative or predicted request that originated from a client proxy.

Further conserving resources, the server proxy may determine that the server proxy need not transmit a response to a read-ahead request in some instances. As described above, the server proxy maintains or otherwise has access to its own version of the compression dictionary. The compression dictionary associated with the server proxy is synchronized with the compression dictionary associated with the client proxy as an element of the compression protocol. Because the server proxy stores or has access to a synchronized version of the compression dictionary, upon receiving a server response to the read-ahead request, the server proxy may efficiently assess whether the compression dictionary already accounts for that particular response (e.g., by determining that the response compresses properly and inferring that the synchronized dictionary at the client proxy likewise already accounts for the response). The server proxy may also determine whether the request was designated by the client proxy as a read-ahead response rather than an actual client response. When the server proxy determines that the compression dictionary already accounts for the received response (and therefore that the server proxy need not transmit the response to the read-ahead request), it may further reduce network traffic by taking no further action (i.e., avoiding the unwarranted use of connection bandwidth or other resources), by discarding the response (and optionally notifying the client proxy), or by storing the response for future use. In cases in which the server proxy stores responses for future use, the technology may involve transmitting changed fields in place of or in addition to dynamically computing a compression dictionary.

As a further efficiency, the client proxy may flag, mark, or otherwise designate the read-ahead requests as distinguishable from actual client requests. Using the flag, mark, or other designation applied by the client proxy, the server proxy can then distinguish read-ahead requests from actual client requests. Because the server proxy can distinguish read-ahead requests from actual client requests, the server proxy may prioritize actual client requests over read-ahead requests. The server proxy may, for instance, enforce a limitation in which it only processes the read-ahead request when the server connection is idle. The client proxy may likewise only transmit read-ahead requests when the connection is idle (e.g., by delaying transmission of the response until the link has become idle). Either the client proxy or the server proxy may also use the designation to assign greater priority levels to actual client requests than to read-ahead requests. The foregoing technologies, in various combinations, may reduce round trip response times by as much as 70%.

Figure 1:
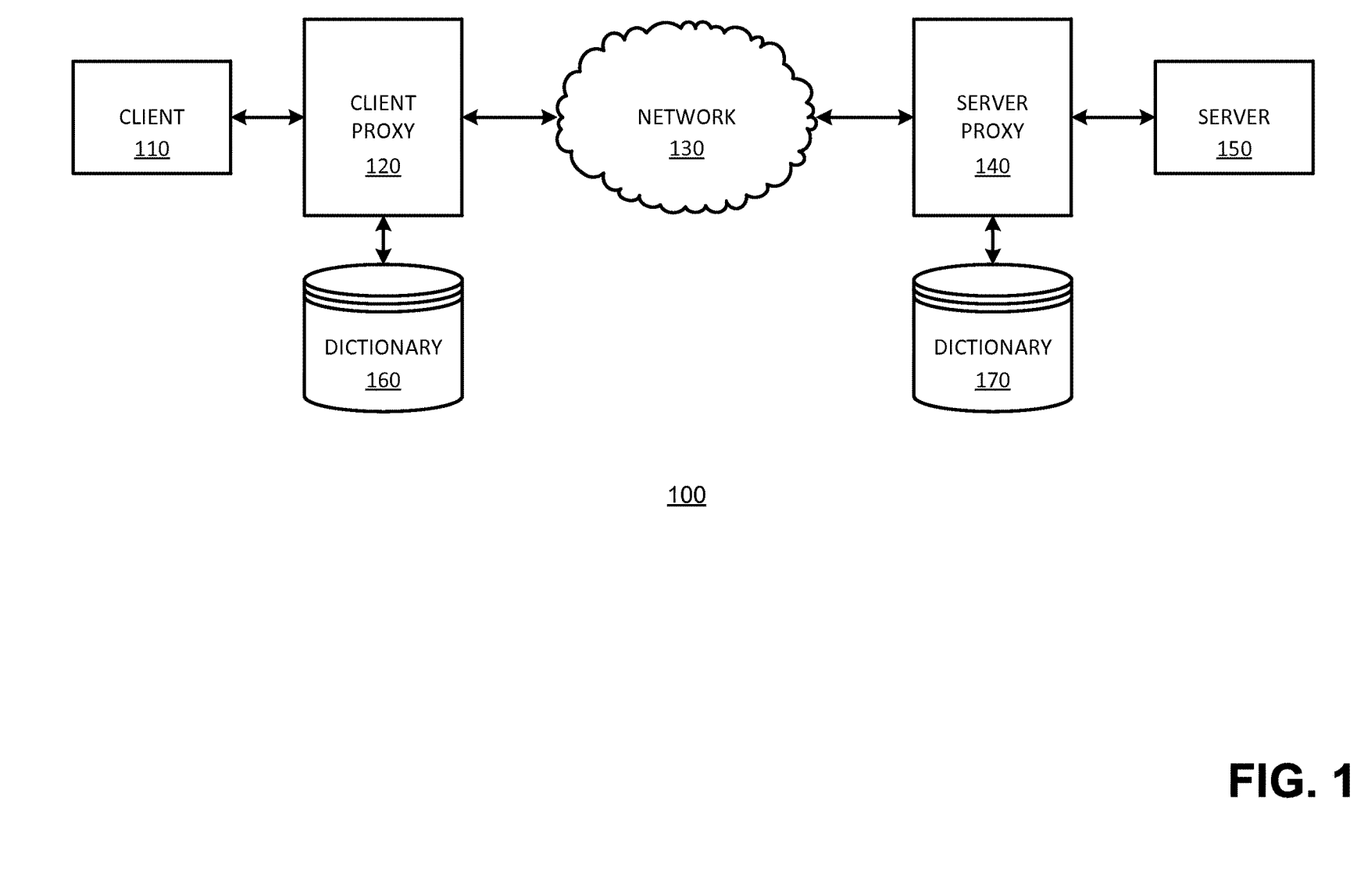
FIG. 1 is a block diagram of an exemplary environment in which technology for reducing network request response times over a server-signed connection may be implemented.

FIG. 1 is a block diagram of an exemplary environment 100 in which innovative technologies for reducing network request response times over a server-signed connection may be implemented. The technologies may be implemented by way of various embodiments (e.g., a system, method, computer-readable non-transitory storage medium, or other form of computer-readable storage media, such as a random-access memory disk) within a variety of network contexts. Accordingly, although certain figures have been presented for the purpose of illustration, they should not be construed as limited to the precise forms disclosed. By way of an example, where FIG. 1 illustrates an exemplary network environment that includes various network devices, such as a client, client proxy, server proxy, and server, persons of ordinary skill in the art will readily appreciate that any given network environment may, in practice, include a host of other network devices, including routers, switches, gateways, bridges, database servers, and other devices. Notwithstanding the network architecture shown, it should be understood that the described embodiment is exemplary and that, in other possible embodiments, the technology may be utilized in connection with numerous other network arrangements.

As shown in FIG. 1, an exemplary environment 100 may include a client 110, a client proxy 120, a communications network 130, a server proxy 140, and a server 150. Client proxy 120 and server proxy 140 may store or have access to compression dictionaries 160 and 170, respectively. As discussed above, compression dictionaries 160 and 170 are synchronized as part of the compression protocol so as to contain the same or highly similar entries.

Client device 110, which may be communicatively coupled to server 150 over network 130, may be any computing device that includes a processor, memory, and a network interface (e.g., a desktop computer, workstation, laptop, smartphone, tablet, electronic reader, a smart watch, various types of mobile devices, or other type of computing device). Client 110 may be communicatively coupled to network 130 by way of the network interface. Client 110 may be coupled either directly to network 130 or through any number of intermediate servers, gateways, or other network devices. As shown in environment 100, client 110 is coupled to network 130 by way of client proxy 120, which serves as an inline intermediary between client 110 and other devices communicatively coupled to network 130.

Network 130 may be implemented as a private network, a public network, an intranet, a wide area network, the Internet, a local area network, or any suitable combination of the foregoing. In the context of exemplary environment 100 shown in FIG. 1, network 130 is a wide area network (e.g., the Internet).

Client proxy 120 may be a computing device that includes a processor, memory, and a network interface (e.g., a server, desktop computer, workstation, laptop, smartphone, tablet, electronic reader, a smart watch, various types of mobile devices, or other type of computing device). Client proxy 120 may be communicatively coupled to network 130 by way of the network interface. Although illustrated in FIG. 1 as a standalone computing device, client proxy 120 may be incorporated into client 110 or another network device (e.g., a transparent bridge). Client proxy 120 may store and maintain or otherwise have access to compression dictionary 160. Client proxy 120 may, in accordance with the presently disclosed technology, dynamically compute compression dictionary 160 based on responses to read-ahead requests or other requests. Where client proxy 120 dynamically computes compression dictionary 160, dynamically computing compression dictionary 160 may include generating speculative or "read-ahead" client requests, analyzing responses to the read-ahead requests or other requests (e.g., actual client requests), and adding to compression dictionary 160 one or more entries that correspond to any read-ahead or other responses for which one or more entries do not already exist in compression dictionary 160 (e.g., one or more entries required to successfully compress an actual client response that is identical or highly similar to the response to a predicted read-ahead request). Compression dictionary 160 may be stored within client proxy 120 or it may be stored on a separate and distinct network device to which client proxy 120 is communicatively coupled.

Server proxy 140 may be a computing device that includes a processor, memory, and a network interface (e.g., a server, desktop computer, workstation, laptop, smartphone, tablet, electronic reader, a smart watch, various types of mobile devices, or other type of computing device).

Server proxy 140 may be communicatively coupled to network 130 by way of the network interface. Although illustrated in FIG. 1 as a standalone computing device, server proxy 140 may also be incorporated into server 150 or another network device. Server proxy 140 stores and maintains or otherwise has access to compression dictionary 170. Server proxy 140, in accordance with the presently disclosed technology, dynamically computes compression dictionary 170 based on responses to read-ahead or other types of requests (e.g., actual client requests). Compression dictionary 170 may be stored within server proxy 140 or it may be stored on a separate and distinct network device to which server proxy 140 is communicatively coupled (e.g., a network device residing within a common local area network). Server proxy 140 may execute a compression protocol by which compression dictionary 170 is synchronized with compression dictionary 160 associated with client proxy 120. As a result, server proxy 140 may infer information about compression dictionary 160 by assessing its own compression dictionary 170 (e.g., whether or not a particular response to a read-ahead request or other type of request is accounted for by compression dictionary 160).

In an exemplary synchronization process, as server proxy 140 compresses a response, any terms in the response that are in the dictionary are replaced with the dictionary code. Any compressible terms not in compression dictionary 170 are inserted into compression dictionary 170 and also transmitted with the new dictionary code. When client proxy 120 subsequently decompresses the compressed response, client proxy 120 looks up the dictionary code for each term in the response. Client proxy 120 inserts any new terms into compression dictionary 160 along with the new dictionary code. Thus, when server proxy 140 compresses a response for transmission, server proxy 140 ultimately causes dictionary codes to be entered into both compression dictionary 160 and compression dictionary 170. In embodiments in which client proxy 120 compresses a request to transmit to server proxy 140, client proxy 120 likewise causes codes to be entered into both into both compression dictionary 160 and compression dictionary 170.

Client proxy 120 and server proxy 140 may be highly similar or identical computing devices. In such cases, client proxy 120 and server proxy 140 may discern their respective roles based on certain parameters exchanged when the network connection is established. Server proxy 140 may, for instance, recognize when a marked connection comes from client proxy 120, while client proxy 120 may recognize when the mark is absent.

Server 150 may be a computing device that includes a processor, memory, and a network interface (e.g., a server, desktop computer, workstation, laptop, smartphone, tablet, electronic reader, a smart watch, various types of mobile devices, or other type of computing device). Server 150 may be communicatively coupled to network 130 by way of the network interface. Server 150 may a web server, a resource server, a database server, an application server, a domain controller, or any other type of server that operates within a server-signing environment.

Figure 2A:
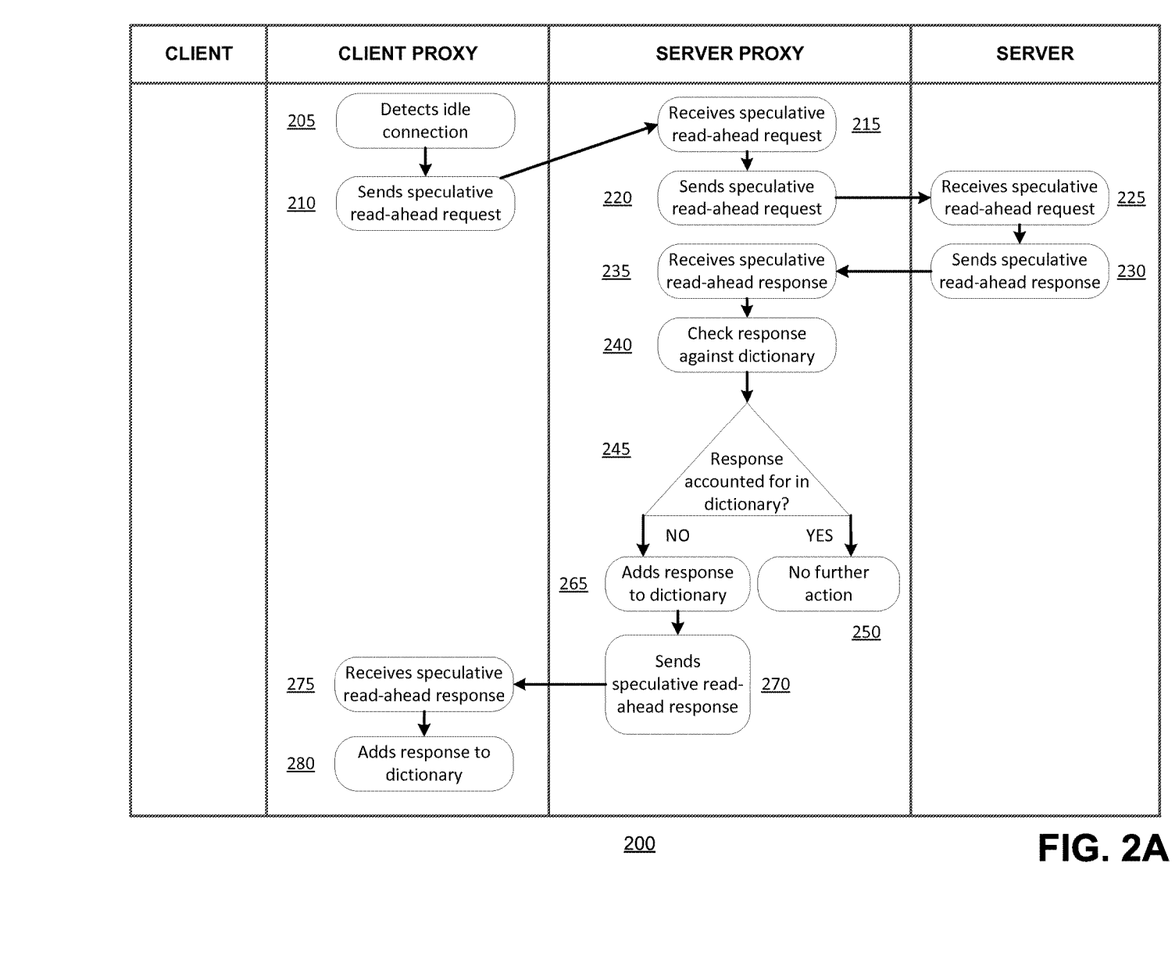
FIG. 2A is a flow diagram illustrating an exemplary method for reducing network request response times over a server-signed connection.

FIG. 2A is a flow diagram illustrating an exemplary method 200 for reducing network request response times over a server-signed connection. More particularly, FIG. 2A illustrates an exemplary flow of data between various network devices in an illustrative network environment. Although FIG. 2A illustrates responsibilities executed by a client, a client proxy, a server proxy, and a server, persons of ordinary skill in the art will readily recognize that the foregoing devices are merely exemplary and that other embodiments of the present technology may be applied within the context of other network devices depending on the network architecture at issue. In the example shown in FIG. 2A, the network connection employs a protocol that requires server signing (e.g., SMB) and permits client proxy 120 of FIG. 1 to impersonate client 110. Client proxy 120 and server proxy 140 may each be an unsigning, inline, transparent proxy.

At block 205, client proxy 120 of FIG. 1 may detect that the network connection has gone idle. Employing the presently disclosed technologies during idle periods takes advantage of valuable idle connection time that would otherwise be wasted. Detecting that the network connection has gone idle also permits client proxy 120 to avoid spending network resources on a read-ahead request when an actual client request needs to be handled (either by client proxy 120 or another network device along the network connection). At block 210, client proxy 120 may send a read-ahead request or other type of request to server proxy 140 of FIG. 1. As noted above, a read-ahead request may be characterized as a speculative read-ahead request in the sense that client proxy 120 may issue the request based on a prediction that it will subsequently receive an actual client request that mirrors or is highly similar to the speculative read-ahead request. In some instances, the prediction may be based on previously received client requests or responses thereto, while in other instances the prediction may be based on an assessment of other network conditions or events. The latter allows the presently disclosed technologies to reduce network request response times even for requests whose response data may not have been seen before (e.g., on a cold cache), which provides better initial responses on newly deployed systems or systems with new data.

Client proxy 120 may flag, mark, or otherwise designate the read-ahead request as distinguishable from an actual client request received from client 110 of FIG. 1 (e.g., via a custom IOCTL request, by use of TCP options, or TCP urgent data, via protocol extensions, abuse of reserved but unused fields in standard structures, or other techniques). Designating the read-ahead request as distinguishable from an actual client request may permit server proxy 140 to prioritize actual client requests over the read-ahead request.

At block 215, server proxy 140 may receive the speculative read-ahead request. At block 220, server proxy 140 may send the speculative read-ahead request to server 150. Server 150 may, at block 225, receive the speculative read-ahead request and, at block 230, may process the request and send a response to the read-ahead request back to server proxy 140. At block 235, server proxy 140 may receive the response to the speculative read-ahead request from server 150.

Server proxy 140 may then, at block 240, check the response against compression dictionary 170 of FIG. 1. At block 245, server proxy may determine whether the response is already accounted for in compression dictionary 170. Determining whether compression dictionary 170 already accounts for the response may include attempting to compress the response using compression dictionary 170. Depending on the ability of server proxy 140 to compress the response using compression dictionary 170, server proxy 140 may determine that the response is already accounted for in compression dictionary 170.

Server proxy 140 may determine that the response is not already accounted for by compression dictionary 170 (and by extension synchronized compression dictionary 160 of client proxy 120) when a level of data size reduction fails to meet or exceed a predetermined data size reduction metric (e.g., the size of the data is reduced by 70% or greater). Server proxy 140 may determine that the response is not already accounted for by compression dictionary 170 when compressing the response requires adding to compression dictionary 170 at least one new dictionary entry associated with the response. Server proxy 140 may determine that the response is not already accounted for by compression dictionary 170 when compressing the response requires adding to compression dictionary 170 a plurality of new dictionary entries associated with the response. Server proxy 140 may determine that the response is not already accounted for by compression dictionary 170 when compressing the response requires adding to compression dictionary 170 a quantity of new dictionary entries that exceeds a predetermined quantity of dictionary entries (e.g., 5 new dictionary entries).

Server proxy 140 may determine that the response is already accounted for by compression dictionary 170 when a level of data size reduction meets or exceeds a predetermined data size reduction metric (e.g., the size of the data is reduced by 70% or greater). Server proxy 140 may determine that the response is already accounted for by compression dictionary 170 when compressing the response does not require adding to compression dictionary 170 any new dictionary entry associated with the response. Server proxy 140 may determine that the response is already accounted for by compression dictionary 170 when compressing the response requires adding to compression dictionary 170 a quantity of new dictionary entries that does not exceed a predetermined quantity of dictionary entries (e.g., 5 new dictionary entries).

Because compression dictionary 170 associated with server proxy 140 and compression dictionary 160 associated with client proxy 120 are synchronized during execution of the compression protocol, server proxy 140 can accurately infer that compression dictionary 160 contains the requisite dictionary entries to decompress the response when compression dictionary 170 contains the requisite dictionary entries to compress the response. Although the use of read-aheads takes advantage of idle connection time, the foregoing process (e.g., blocks 215 through blocks 245) applies in the context of any requests and any responses and should not be construed as limited to the use of read-aheads. Server proxy 140 may, for instance, dynamically compute compression dictionary 170 based on responses to actual client requests.

When client proxy 120 flags, marks, or otherwise designates the read-ahead request as distinguishable from an actual client request received from client, server proxy 140 may identify the read-ahead request as a read-ahead request. When server proxy 140 identifies the read-ahead request as distinguishable from an actual client request and determines that server proxy 140 need not use valuable network resources transmitting sending the response to client proxy 120 for the purpose of populating compression dictionary 160, server proxy 140 may discard the response received from server 150. Alternatively, having recognized that the read-ahead request was not an actual client request, server proxy 140 may take no further action as illustrated at block 250. In scenarios in which server proxy 140 does not distinguish the read-ahead request from an actual client request and, as a result, server proxy 140 must transmit the response back to client proxy 120, the response may still be sent during idle time and will compress and decompress well when accounted for by compression dictionaries 160 and 170. Server proxy 140 may also store the response for future use (e.g., the transmission of changed fields). Server proxy 140 may, for instance, store a copy of the response for future reference when transmitting only changed fields to client proxy 120. Client proxy 120, having previously received the response, may have a copy of the response stored in memory. When server proxy 140 receives a request similar to the previous request, server proxy 140 may reference the previous response stored in memory and transmit only the fields that represents differences between two responses. Server proxy 140 may also notify client proxy 120 not to expect a response.

Figure 2B:
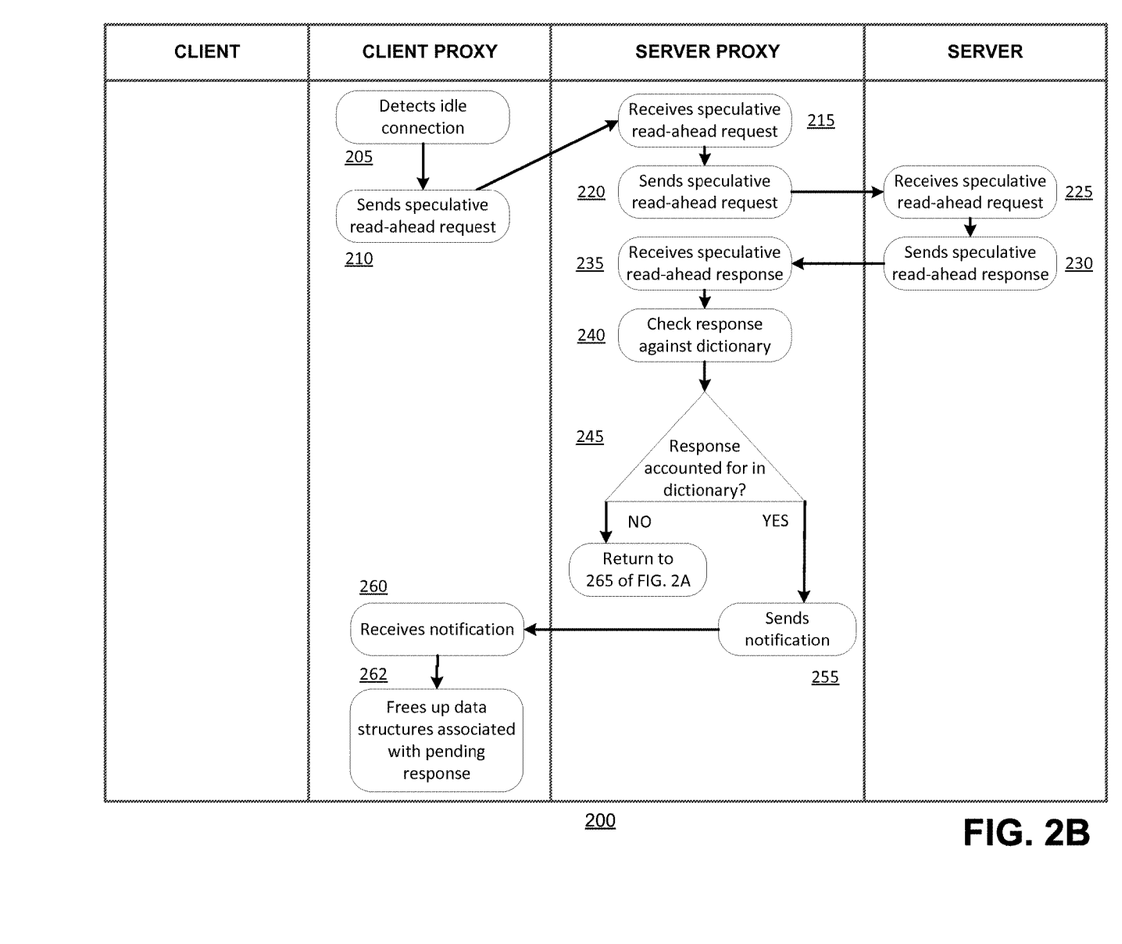
FIG. 2B is a flow diagram further illustrating an exemplary method for reducing network request response times over a server-signed connection.

FIG. 2B is a flow diagram further illustrating an exemplary method for reducing network request response times over a server-signed connection. Blocks 205 through 245 illustrated in FIG. 2B are identical to those illustrated in FIG. 2A. In the example illustrated in FIG. 2B, however, server proxy 140 does perform an action when server proxy 140 determines that compression dictionary 170 (and by inference compression dictionary 160) already accounts for the response. At block 255, server proxy 140 sends a notification to client proxy 120 indicating that client proxy 120 should not expect to receive a compressed response. Client proxy 120 may receive the notification at block 260 and, in response at block 262, may free up any data structures associated with the otherwise anticipated response. Although not illustrated, server proxy 140 may also store the response in memory for future use (e.g., for transmitting changed fields as explained above).

Referring back to FIG. 2A, at block 265, server proxy 140 may determine that compression dictionary 170 does not already account for the response at issue and that, as a result, server proxy 140 should use network resources transmitting the response to client proxy 120 for the purpose of populating compression dictionary 160. Server proxy 140 may make the foregoing determination based on a successful compression using compression dictionary 170. In some embodiments, server proxy 140 may also make the determination based on the absence of a flag or mark distinguishing the read-ahead request from an actual client request. As explained above, when determining whether to add the response to the read-ahead request to compression dictionary 170, server proxy 140 may determine how many entries associated with the response need to be added to compression dictionary 170 (e.g., at least one, a plurality, or above or below a predetermined quantity of new dictionary entries) and may infer that the response is already accounted for based on the number of missing entries or the number of matching entries already present. Server proxy 140 may also consider other measures of compression performance, such as the speed at which server proxy 140 is able to compress the response, the amount of resources required to do so, or a number of other measures. After determining that compression dictionary 170 (and by inference compression dictionary 160) does not already contain one or more entries corresponding to the response to the read-ahead request, server proxy 140 may add the response to compression dictionary 170. Adding the response to compression dictionary 170 may include adding any compressible terms or entries not already present in compression dictionary 170.

Server proxy 140 may discard the response to the read-ahead request when compression dictionary 160 already contains sufficient entries corresponding to the response to permit client proxy 120 to successfully decompress a corresponding response to an actual client request. Server proxy 140 may send to client proxy 120 a notification that server proxy 140 has discarded the response.

Server proxy 140 may then, at block 270, send the response to the speculative read-ahead request to client proxy 120. Client proxy 120 may receive the response to the speculative read-ahead request at block 275. At block 280, client proxy 120 may add the response to the speculative read-ahead request to compression dictionary 160 stored in memory of or otherwise accessible by client proxy 120. Adding the response to compression dictionary 160 may include decompressing the response and adding new dictionary entries associated with the response. Having pre-populated compression dictionary 160 based on the response, client proxy 120 may then discard the response.

Figure 3:
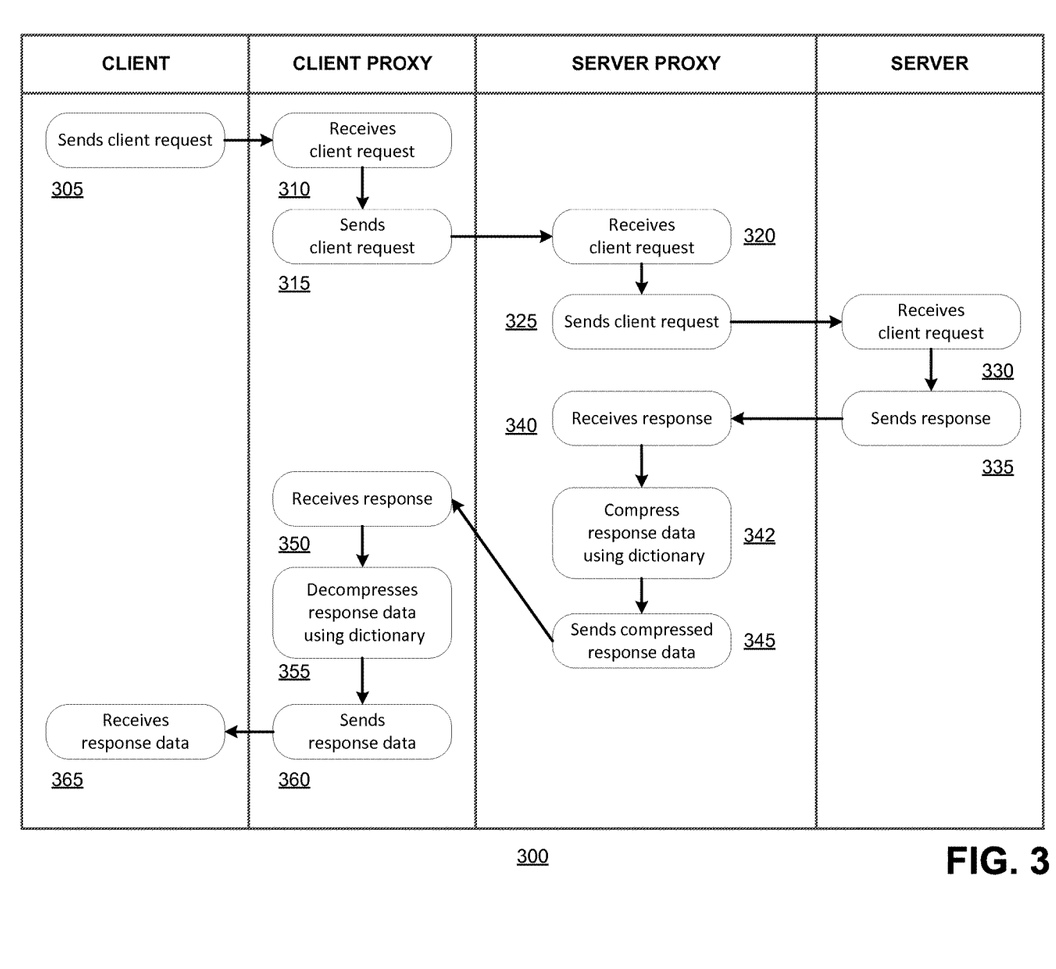
FIG. 3 is a flow diagram further illustrating an exemplary method for reducing network request response times over a server-signed connection.

FIG. 3 is a flow diagram further illustrating an exemplary method 300 for reducing network request response times over a server-signed connection. While FIGS. 2A and 2B illustrate the use of read-ahead operations to pre-populate inline compression dictionary 160 of client proxy 120, FIG. 3 illustrates how the network request response time is reduced by compressing the response data despite not being able to supply a cached or otherwise stored copy of the response (as would be the case in the context of conventional read-ahead operations on a non-signing connection or on a signing connection featuring non-transparent proxies that have access to signing keys).

At block 305, client 110 may transmit a client request (i.e., an actual client request as opposed to the read-ahead request generated by and originating from client proxy 120). At block 310, client proxy 120 may receive the client request. Where client proxy 120 is a transparent proxy, client proxy 120 may intercept the client request while remaining transparent to client 110. Client proxy 120 may send the client request to server proxy 140 at block 315. Server proxy 140, which may operate transparently, may receive the client request at block 320 and send the request to server 150 at block 325. At block 330, server 150 may receive the client request as if the request has been transmitted directly from client 110 to server 150 (e.g., by virtue of the transparent nature of client proxy 120 and server proxy 140). Server 150 may then, at block 335, process the client request and transmit the response data. Server proxy 140 may receive the response to the client request at block 340. Server proxy 140 may transparently intercept the response to the client request. At block 342, server proxy 140 may compress the response data using compression dictionary 170. At block 345, server proxy 140 may send the compressed response to client proxy 120. Client proxy 120 may receive the response at block 350 and, at block 355, may decompress the response data using compression dictionary 160 that was previously populated at block 280 of FIG. 2A. Client proxy 120 may then transmit the decompressed response data to client 110. By compressing the response at block 342 (which is subsequent decompressed by client proxy 120 using synchronized compression dictionary 160), server proxy 140 greatly reduces the total round trip time during which client 110 would otherwise have to wait for a response. By compressing (in conjunction with the read-ahead request) the actual response signed and transmitted by server 150 in response to the delivered client request (as opposed to transmitting a previously cached copy of the response in the case of conventional read-ahead operations), the presently disclosed technology overcomes the problems associated with mismatches message IDs and signing fields.

In some instances, client proxy 120 may reduce the response time even further by transmitting a previously stored and modified copy of a server response to a previously transmitted read-ahead request. Namely, when client proxy 120 can, either exactly or with a high degree of accuracy, predict what future actual client request it will receive from client 110, client proxy 120 may issue a read-ahead request matching the predicted actual client request. Client proxy 120 may be able to make a sufficiently accurate prediction when, for example, client 110 has been receiving a file a block at a time and continues to request data in the same or similar sizes. Client proxy 120 may then store the received response in memory (compressing the response using compression dictionary 160 when such an entry exists). In such cases, although the stored response may not be accepted by client 110 as is on account of mismatched message IDs or signing fields (e.g., where the two responses are not sufficiently similar), server proxy 140 may send client proxy 120 the correctly matching message ID and/or signing field. Client proxy 120 may then replace the message ID and/or signing field in the stored response (i.e., the response to the read-ahead request predicted to match the actual client request). In doing so, client proxy 120 may effectively create a valid signed response while transmitting little data (e.g., a 4K read response could be reduced to approximately 30 bytes). Any time client proxy 120 receives the same request from client 110, server proxy 140 may forward client proxy 120 the updated message ID and signing fields so that client proxy 120 may turn the previously stored response into a valid signed response.

In yet a further embodiment, a non-transitory computer-readable storage medium may store an executable computer program. When executed by a processor, the program may perform the methods described above in the context of FIGS. 2 and 3.

Figure 4:
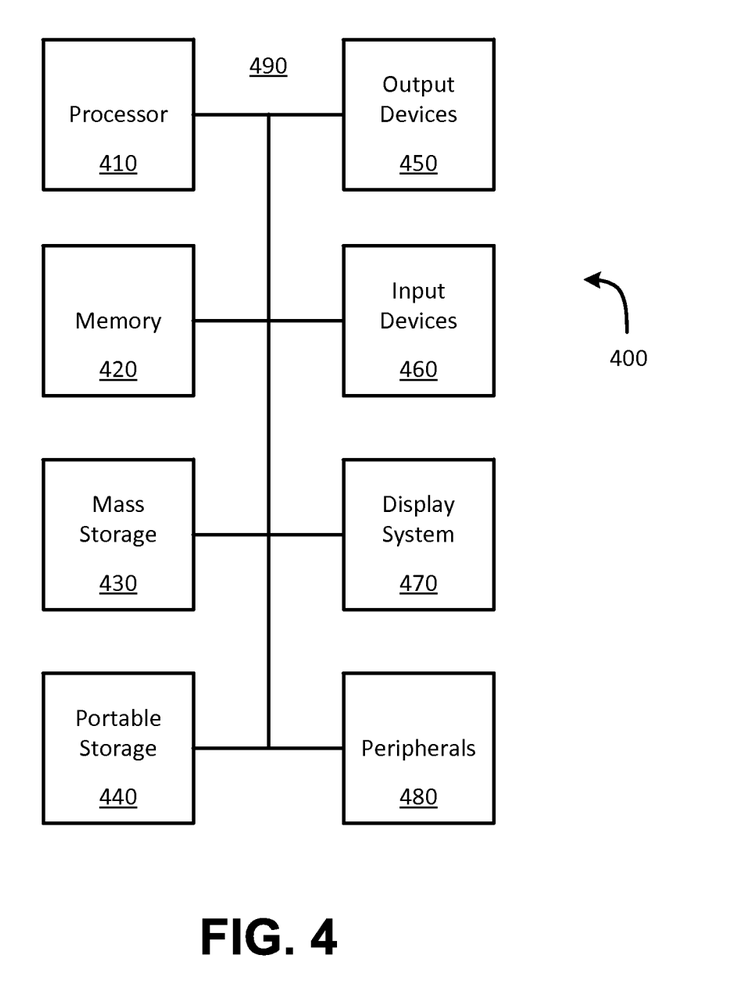
FIG. 4 is a block diagram of an exemplary system for implementing a computing device.

FIG. 4 is a block diagram of an exemplary system 400 for implementing a computing device. The computing system 400 of FIG. 4 may be implemented in the context of client 110, client proxy 120, a server proxy 140, or server 150 of FIG. 1. The computing system of FIG. 4 may include one or more processors 410 and memory 420. Main memory 420 may store, in part, instructions and data for execution by processor 410. Main memory 420 may store the executable code when in operation. Computing system 400 may further include a mass storage device 430, a portable storage medium drive 440, output devices 450, user input devices 460, a graphics display system 470, and peripheral devices 480.

The components shown in FIG. 4 are depicted as being connected via a single bus 490. The components may alternatively be connected through one or more data transport means. Processor 410 and main memory 420, for example, may be connected via a local microprocessor bus. Mass storage device 430, peripheral device(s) 480, portable storage device 440, and display system 470 may be connected via one or more input/output buses.

Mass storage device 430, which may be implemented with a magnetic disk drive or an optical disk drive, may be a non-volatile storage device for storing data and instructions for use by processor 410. Mass storage device 430 may store system software for implementing embodiments of the solution described herein for purposes of loading the software into main memory 420.

Portable storage device 440 may operate in conjunction with a portable non-volatile storage medium, such as a compact disk or digital video disc, to input and output data and code to and from computer system 400. The system software for implementing embodiments of the present solution may be stored on such a portable medium and input to computer system 400 via portable storage device 440.

Input devices 460 may provide a portion of a user interface. Input devices 460 may include an alpha-numeric keypad, such as a keyboard, touch screen, or touchpad, for inputting alpha-numeric and other information, or a pointing device, such as a mouse, a trackball, stylus, or cursor direction keys. Additionally, system 400 may include output devices 450, such as speakers, printers, network interfaces, monitors, and the like.

Display system 470 may include a liquid crystal display or other suitable display device. Display system 470 may receive textual and graphical information and may process the information for output to the display device.

Peripherals 480 may include any type of computer support device to add additional functionality to computer system 400. Peripheral device 480 could be, for example, a modem or a router.

The components illustrated in computer system 400 of FIG. 4 are those typically found in computer systems that may be suitable for use with embodiments of the present solution. The depiction of such components is not intended to be exhaustive in nature, but is rather intended to represent a broad category of computer components that are well known in the art. Thus, system 400 may be a desktop computer, workstation, server, mainframe computer, laptop, tablet, smartphone or other mobile or hand-held computing device, or any other suitable computing device. Computer system 400 may also include various bus configurations, networked platforms, multi-processor platforms, and the like. Various operating systems may be used, such as Unix, Linux, Windows, Macintosh OS, Palm OS, and other suitable operating systems.

The technology described herein constitutes a novel, substantial, and meaningful improvement to the technical process of responding to network requests in environments employing server-signing protocols (e.g., SMB). By using read-ahead operations to pre-populate an inline compression dictionary stored on or accessible by client proxy 120 of FIG. 1, the technology permits the compression of responses to actual client requests and greatly reduces the amount of data that client proxy 120 must transmit back to client 110. As a result, network request response times are significantly reduces (e.g., by at least 70% in some cases).

The foregoing detailed description has been presented for purposes of illustration and description. It is not intended to be exhaustive or to limit the technology to the precise form disclosed (e.g., only to SMB protocols or only to the precise network architecture described for illustrative purposes). Many modifications and variations are possible in light of the above teaching. The described embodiments were chosen in order to best explain the principles of the technology and its practical application to enable others skilled in the art to best utilize the technology in various embodiments and with various modifications as suited to the particular use contemplated. It is intended that the scope of the technology be defined by the claims.

What is claimed is:

1. A system for reducing network request response times over a server-signed network connection, the system comprising:

a client proxy that communicates with a client over a network connection running a server-signing protocol, wherein the client proxy generates a read-ahead request that matches a predicted future client request and sends the read-ahead request over the communication network; and a server proxy that:
receives the read-ahead request from the client proxy over the network connection,
identifies the received request as a read-ahead request rather than a client request originating from the client based on the received request including a distinguishing identifier that distinguishes the read-ahead request from client requests and that assigns higher priority to client requests relative to the read-ahead request, and executes instructions stored in memory, wherein execution of the instructions processes the read-ahead request when the network connection is idle in accordance with the higher priority assigned to client requests, wherein processing the read-ahead request comprises:

sending the read-ahead request to a server communicatively coupled to the server proxy over the network connection, receiving from the server a response to the read-ahead request, compressing the response to the read-ahead request using a compression dictionary associated with the server proxy, and sending the compressed read-ahead response to the client proxy, wherein the client proxy modifies the compressed read-ahead response to create a modified response that matches a valid signed response to the predicted future client request.

2. The system of claim 1, wherein the server proxy sends the compressed read-ahead response to the client proxy when a level of data size reduction fails to at least meet a predetermined data size reduction metric.

3. The system of claim 1, wherein the server proxy sends the compressed read-ahead response to the client proxy when compressing the response requires adding to the compression dictionary at least one new dictionary entry associated with the response.

4. The system of claim 1, wherein the server proxy sends the compressed read-ahead response to the client proxy when compressing the response requires adding to the compression dictionary a plurality of new dictionary entries associated with the response.

5. The system of claim 1, wherein the server proxy sends the compressed read-ahead response to the client proxy when compressing the response requires adding to the compression dictionary a quantity of new dictionary entries that exceeds a predetermined quantity of dictionary entries.

6. The system of claim 1, wherein the server proxy does not send the compressed read-ahead response to the client proxy when a level of data size reduction at least meets a predetermined data size reduction metric.

7. The system of claim 1, wherein the server proxy does not send the compressed read-ahead response to the client proxy when compressing the response does not require adding to the compression dictionary any new dictionary entry associated with the response.

8. The system of claim 1, wherein the server proxy does not send the compressed read-ahead response to the client proxy when compressing the response requires adding to the compression dictionary a quantity of new dictionary entries that does not exceed a predetermined quantity of dictionary entries.

9. The system of claim 8, wherein the server proxy prioritizes transmitting a response to a client request over transmitting the compressed response to the read-ahead request.

10. The system of claim 1, wherein sending the read-ahead request to the server is limited to sending the read-ahead request when the network connection is idle.

11. The system of claim 1, wherein the server proxy receives and compresses a response to a client request using the compression dictionary associated with the server proxy.

12. The system of claim 11, wherein the server transmits the compressed client response to the client proxy over the network connection.

13. The system of claim 12, wherein the client proxy decompresses the compressed client response using a compression dictionary associated with the client proxy, the compression dictionary synchronized with the compression dictionary associated with the server proxy.

14. The system of claim 13, wherein the client proxy sends to the client the decompressed response to the client request.

15. A system for reducing network request response times over a server-signed network connection, the system comprising:

a server proxy that communicates with a server over a network connection running a server-signing protocol; and a client proxy that:

sends a first read-ahead request to the server proxy over the network connection that matches a predicted future client request, the read-ahead request including a distinguishing identifier that distinguishes the read-ahead request from client requests and that assigns higher priority to client requests relative to the read-ahead request, wherein the server proxy identifies the read-ahead request as the read-ahead request rather than a client request originating from the client based on the distinguishing identifier included in the read-ahead request, receives from the server proxy a compressed response to the first read-ahead request, decompresses the compressed response to the first read-ahead request using a compression dictionary, and modifies the decompressed first read-ahead response to create a modified response matches a valid signed response to the predicted future client request.

16. The system of claim 15, wherein decompressing the compressed response to the first read-ahead request includes populating the compression dictionary with one or more new dictionary entries associated with the response.

17. The system of claim 15, wherein the client proxy sends a second read-ahead request to the server proxy over the network connection and receives from the server proxy a notification indicating that the client proxy will not receive a response to the second read-ahead request from the server proxy.

18. The system of claim 17, wherein the client proxy frees up one or more data structures associated with the second read-ahead request when the client proxy receives the notification.

19. The system of claim 15, wherein the client proxy designates the read-ahead request as distinguishable from the client request before sending the read-ahead request to the server proxy by including the identifier in the read-ahead request.

20. The system of claim 19, wherein the server proxy prioritizes transmitting a response to a client request over transmitting the compressed response to the read-ahead request.

21. The system of claim 15, wherein the client proxy only receives the compressed response to the read-ahead client response when the connection is idle.

22. The system of claim 16, wherein the compression dictionary associated with the client proxy is synchronized with a compression dictionary associated with the server proxy.

23. The system of claim 22, wherein the client proxy sends a client request to the server proxy and receives from the server proxy a compressed response to the client request.

24. The system of claim 23, wherein the client proxy decompresses the compressed response to the client request using the compression dictionary associated with the client proxy.

25. The system of claim 24, wherein the client proxy sends to the client the decompressed response to the client request.

* * * * *